United States Patent
Yen et al.

(10) Patent No.: US 7,541,846 B2
(45) Date of Patent: Jun. 2, 2009

(54) SAMPLE-AND-HOLD APPARATUS AND OPERATING METHOD THEREOF

(75) Inventors: Chih-Jen Yen, Hsinchu (TW); Chih-Yuan Hsieh, Hsinchu (TW); Chiu-Hung Cheng, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 116 days.

(21) Appl. No.: 11/744,225

(22) Filed: May 4, 2007

(65) Prior Publication Data
US 2008/0211545 A1 Sep. 4, 2008

(30) Foreign Application Priority Data
Mar. 1, 2007 (TW) .............................. 96106938 A

(51) Int. Cl.
*G11C 27/02* (2006.01)
*H03K 17/00* (2006.01)
(52) U.S. Cl. .............................. 327/91; 327/94; 327/95; 327/96
(58) Field of Classification Search .................. 327/91, 327/94, 95, 96
See application file for complete search history.

(56) References Cited

U.S. PATENT DOCUMENTS

| | | | | |
|---|---|---|---|---|
| 4,068,136 A | * | 1/1978 | Minami | 327/96 |
| 5,736,879 A | * | 4/1998 | Pham | 327/102 |
| 5,874,842 A | * | 2/1999 | Masuta | 327/96 |
| 5,982,205 A | * | 11/1999 | Vallancourt | 327/94 |
| 2004/0017225 A1 | * | 1/2004 | Draxelmayr | 327/94 |

* cited by examiner

*Primary Examiner*—Tuan Lam
(74) *Attorney, Agent, or Firm*—Jianq Chyun IP Office

(57) ABSTRACT

A sample-and-hold apparatus and an operating method thereof are provided. The sample-and-hold apparatus includes a sampling amplifier, a transistor, a first switch, a second switch, a sampling capacitor, and a drain-charge unit. A first input terminal of the sampling amplifier receives an input signal. A first-terminal of the transistor is coupled to a first voltage. The first switch is coupled between an output terminal of the sampling amplifier and a gate of the transistor. The first and second terminals of the second switch are coupled to a second terminal of the transistor and a second input terminal of the sampling amplifier, respectively. The first and second terminals of the sampling capacitor are coupled to the gate of the transistor and a reference voltage. The drain-charge unit for draining/providing charges has first and second terminals coupled to the second terminal of the second switch and a second voltage, respectively.

36 Claims, 16 Drawing Sheets

SAMPLE-AND-HOLD APPARATUS AND OPERATING METHOD THEREOF

CROSS-REFERENCE TO RELATED APPLICATION

This application claims the priority benefit of Taiwan application serial no. 96106938, filed Mar. 1, 2007. All disclosure of the Taiwan application is incorporated herein by reference.

BACKGROUND OF THE INVENTION

1. Field of the Invention

The present invention relates to a sample-and-hold apparatus. More particularly, the present invention relates to a sample-and-hold apparatus that prevents output distortion caused by a charge distribution effect and an operating method thereof.

2. Description of Related Art

Usually, many different sample-and-hold apparatuses are used in electronic devices. For example, FIG. 1 is a block diagram of a conventional liquid crystal display (LCD). As an LCD panel 110 commonly has hundreds of (or even thousands of) data lines, a source driver must have the same number of sets of data channels. For a large panel, a source driver composed of thousands of sets of data channels is required for driving the display panel. Therefore, a larger chip area is required to realize the source driver, thus the cost of the source driver is very high. Thus, for reducing cost, multiple data lines must share one set of data channels.

Referring to FIG. 1, the source driver 120 has few data channels (e.g., 80 data channels). During the period of a horizontal line, each data channel is responsible for time division latching 8 digital data D, and converting the 8 digital data D into analog signals successively. Sample-and-hold apparatuses 130 synchronously sample the corresponding analog signals, and store the 8 sampling results in 8 sets of sampling channels in the sample-and-hold apparatuses 130 respectively. In addition, each of the sample-and-hold apparatuses 130 sequentially outputs the previous 8 sampling results to a corresponding demultiplexer 140. The demultiplexer 140 then switches the sampling results to the corresponding data lines on the corresponding display panel 110. Therefore, the source driver 120 needs only 80 sets of data channels to drive 640 data lines on the display panel 110 with the time division multiplex technology.

In the conventional sample-and-hold apparatus, as a read switch is disposed between a sampling capacitor and a read operational amplifier, a charge distribution effect occurs when the parasitic capacitances at the input terminals of the operational amplifier near the capacitances of the sampling capacitor. FIG. 1A is a circuit diagram of a conventional sample-and-hold apparatus. The sample-and-hold apparatus receives an input voltage Vi, and outputs a voltage Vo after sampling. The sample-and-hold apparatus includes switches 11-1 to 11-n, switches 12-1 to 12-n, sampling capacitors 13-1 to 13-n, and a sampling amplifier 14. The parasitic capacitance exists between the input terminal of the sampling amplifier 14 and the ground.

As shown in FIG. 1A, n sets of sampling channels of the conventional sample-and-hold apparatus are composed of the switches 11-1 to 11-n, the switches 12-1 to 12-n, and the sampling capacitors 13-1 to 13-n. The control sequence of the switches in FIG. 1A is as shown in FIG. 1B. When the sampling capacitor 13-(I+1) samples, the voltage value of the previous sampling capacitor 13-(I) is held ($1 \leq I \leq n$), and is output by the sampling amplifier 14. Or, as shown in FIG. 1C, the data are sampled and stored in corresponding sampling capacitors sequentially, and then read out from the sampling amplifier 14 sequentially. Control signals T11-1 to T11-n control the switches 11-1 to 11-n respectively, and control signals T12-1 to T12-n control the switches 12-1 to 12-n. The conventional sample-and-hold apparatus has a serious defect, i.e., the sampled voltages held in the sampling capacitors 13-1 to 13-n will have charge redistribution due to the parasitic capacitance between the input terminal of the sampling amplifier 14 and the ground. In addition, the conventional sample-and-hold apparatus further has clock feed-through effect, charge injection effect, and other effects, thus leading to errors. Due to different input voltages, the error voltages are different, thus leading to non-linear output and the distortion of the output.

In order to reduce the voltage error, an improvement of the conventional sample-and-hold apparatus reduces the error by increasing the capacitances of the sampling capacitors 13-1 to 13-n. However, the increase of capacitances will cause the increase of the overall power consumption accordingly, reduce the speed, and increase the chip area.

FIG. 2 is a circuit diagram of another conventional sample-and-hold apparatus. The sample-and-hold apparatus receives an input voltage Vi, and outputs a voltage Vo after sampling. The sample-and-hold apparatus includes switches 21-1 to 21-n, switches 22-1 to 22-n, sampling capacitors 23-1 to 23-n, and sampling amplifiers 24-1 to 24-n. In FIG. 2, the control sequence of the switches 21-1 to 21-n is similar to the sequence of the control signals T11-i to T11-n in FIG. 1B respectively, and the control sequence of the switches 22-1 to 22-n is similar to the sequence of the control signals T12-1 to T12-n in FIG. 1B respectively. As the sampling capacitors 23-1 to 23-n are directly coupled to the sampling amplifiers 24-1 to 24-n without using the switches, each sampling channel charges the sampling capacitor in the sampling channel (one of 23-1 to 23-n) and the parasitic capacitor of the sampling amplifier (one of 24-1 to 24-n) at the same time when the input voltage Vi is sampled. Thus, the charge redistribution is prevented. However, as the read switches 22-1 to 22-n are disposed subsequent to the sampling amplifiers 24-1 to 24-n, each set of the sampling channels needs one corresponding read sampling amplifier (in FIG. 2, n sets of sampling channels are provided, so n sampling amplifiers are required). Therefore, the chip area will be increased greatly according to the conventional art.

SUMMARY OF THE INVENTION

The present invention is directed to a sample-and-hold apparatus and an operating method thereof, so as to prevent output distortion caused by the charge distribution effect.

The present invention is also directed to a sample-and-hold apparatus having a plurality of sets of sample-and-hold units and an operating method thereof. The sample-and-hold units sequentially sample an input voltage, and prevent the output distortion caused by the charge distribution effect.

In order to solve the above problems, the present invention provides a sample-and-hold apparatus, which includes a sampling amplifier, a transistor, a first switch, a second switch, a sampling capacitor and a drain-charge unit. A first input terminal of the sampling amplifier receives an input signal. A first terminal of the transistor is coupled to a first voltage. The first switch is coupled between an output terminal of the sampling amplifier and a gate of the transistor. A first terminal of the second switch is coupled to a second terminal of the transistor, and a second terminal of the second switch is coupled to a second input terminal of the sampling amplifier. A first terminal of the sampling capacitor is coupled to the gate of the transistor, and a second terminal of the sampling capacitor is coupled to a reference voltage. The drain-charge unit for draining/providing charges has a first terminal coupled to the second terminal of the second switch and a second terminal coupled to a second voltage.

The present invention provides an operating method of a sample-and-hold apparatus. During the sampling period, the first switch and the second switch are turned on. During the output period, the first switch is turned off, and the second switch is turned on.

In one embodiment of the present invention, the sample-and-hold apparatus farther includes a third switch and a second drain-charge unit. A first terminal of the third switch is coupled to the second terminal of the transistor. A first terminal of the second charge-drain unit is coupled to a second terminal of the third switch, and a second terminal of the second charge-drain unit is coupled to a third voltage.

The present invention provides an operating method of a sample-and-hold apparatus. During the sampling period, the first switch and the second switch are turned on, and the third switch is turned off. During the output period, the first switch and the second switch are turned off, and the third switch is turned on.

The present invention farther provides a sample-and-hold apparatus, which includes a sampling amplifier, a drain-charge unit, and a plurality of sample-and-hold units. A first input terminal of the sampling amplifier receives an input signal. The drain-charge unit for draining/providing charges has a first terminal coupled to a second input terminal of the sampling amplifier and a second terminal coupled to a first voltage. Each of the sample-and-hold units includes a transistor, a first switch, a second switch, and a sampling capacitor. A first terminal of the transistor is coupled to a second voltage. The first switch is coupled between an output terminal of the sampling amplifier and a gate of the transistor. A first terminal of the second switch is coupled to a second terminal of the transistor, and a second terminal of the second switch is coupled to a second input terminal of the sampling amplifier. A first terminal of the sampling capacitor is coupled to the gate of the transistor, and a second terminal of the sampling capacitor is coupled to a reference voltage.

The present invention provides an operating method of a sample-and-hold apparatus. During an Ith sub-period of the sampling period, the first switch and the second switch of an Ith sample-and-hold unit are turned on, and the first switches and the second switches of other sample-and-hold units are turned off. During an Ith sub-period of the output period, the second switch of the Ith sample-and-hold unit is turned on, the second switches of other sample-and-hold units are turned off, and the first switch of each of the sample-and-hold units is turned off.

In one embodiment of the present invention, each of the sample-and-hold units further includes a third switch which has a first terminal coupled to the second terminal of the transistor. The sample-and-hold apparatus further includes a second drain-charge unit. A first terminal of the second charge-drain unit is coupled to a second terminal of the third switch of each of the sample-and-hold units, and a second terminal of the second charge-drain unit is coupled to a third voltage.

The present invention provides an operating method of a sample-and-hold apparatus. During an Ith sub-period of the sampling period, the first switch and the second switch of an Ith sample-and-hold unit are turned on, the first switches and the second switches of other sample-and-hold units are turned off, and the third switch of each of the sample-and-hold units is turned off. During an Ith sub-period of the output period, the third switch of the Ith sample-and-hold unit is turned on, the third switches of other sample-and-hold units are turned off, and the first switch and the second switch of each of the sample-and-hold units are turned off.

The present invention provides an operating method of a sample-and-hold apparatus. During an Ith period, the first switch and the second switch of an Ith sample-and-hold unit are turned on, and the first switches and the second switches of other sample-and-hold units are turned off. During the Ith period, the third switch of the $(I-1)^{th}$ sample-and-hold unit is turned on, and the third switches of other sample-and-hold units are turned off.

According to the present invention, as the transistor is coupled to the sampling capacitor, the switches are arranged on a path not influencing the voltage values of the sampling capacitor. Thus, the output distortion caused by the charge distribution effect is prevented. The signal is stored in the sampling capacitor by the use of the sampling amplifier, the switches, the sampling capacitor, the transistor, and the drain-charge units, and the sampling results stored in advance are read out by the transistor, the switches, and the drain-charge units. When an output thrust is insufficient, a buffer can be further connected in series.

In order to make the aforementioned features and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
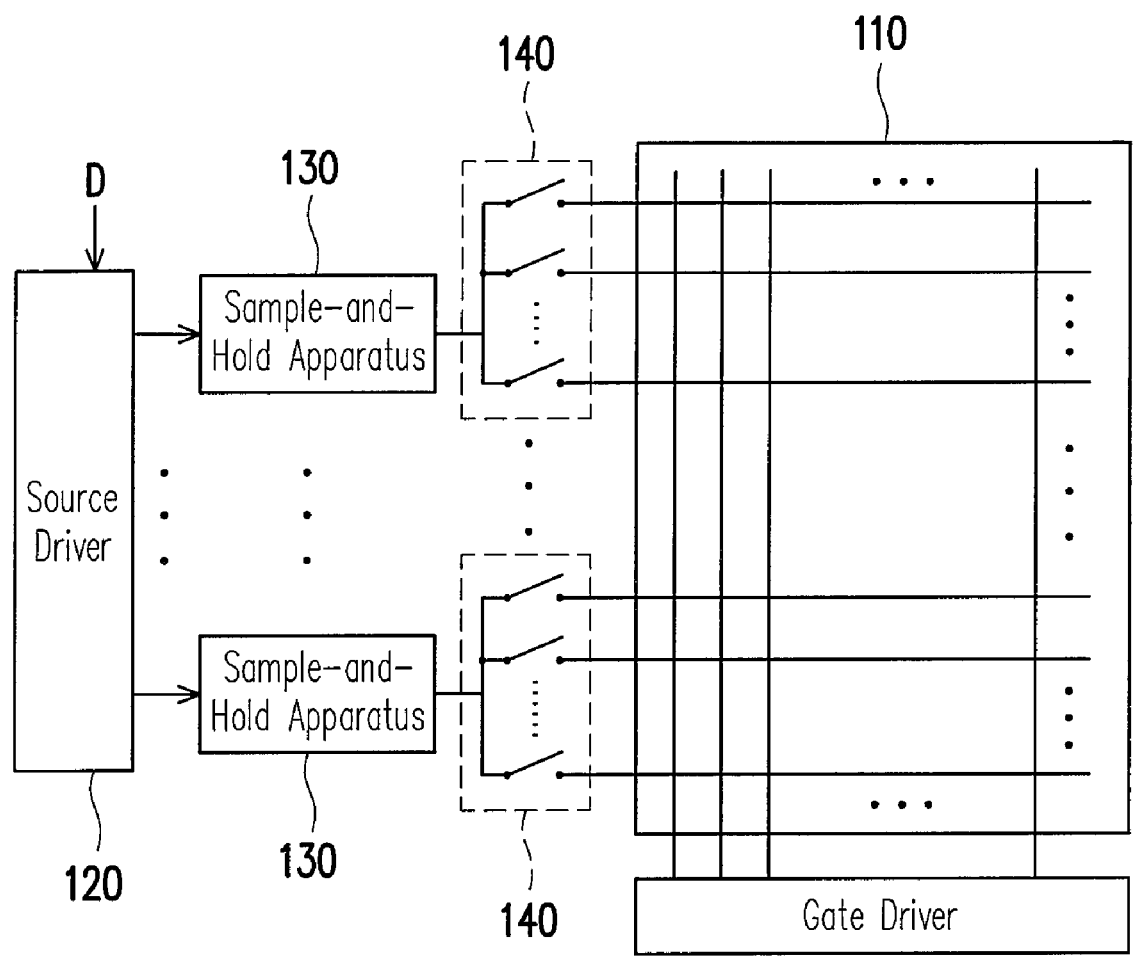
FIG. 1 is a block diagram of a conventional liquid crystal display.
Figure 1A:
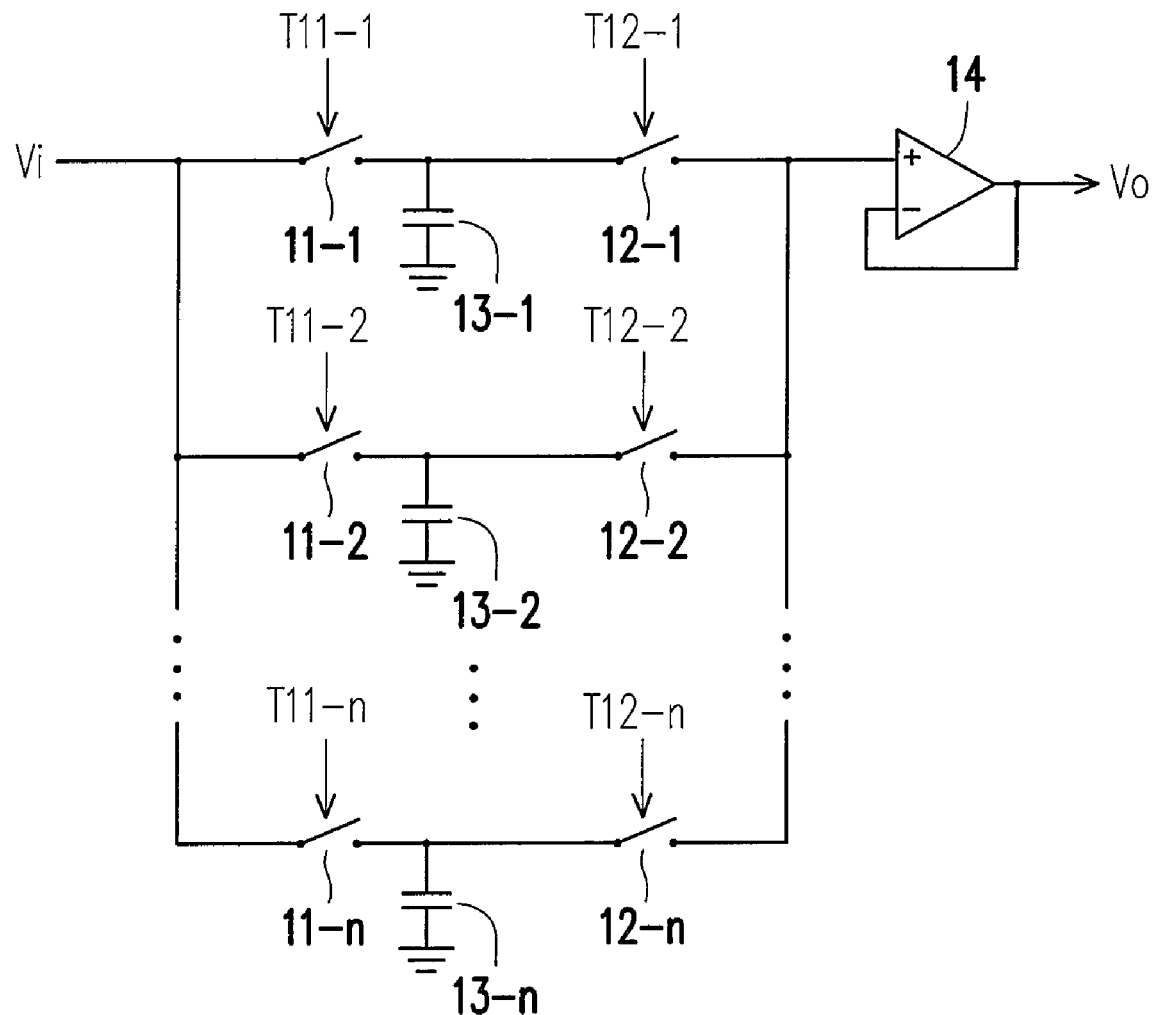
FIG. 1A is a circuit diagram of a conventional sample-and-hold apparatus.
Figure 1B:
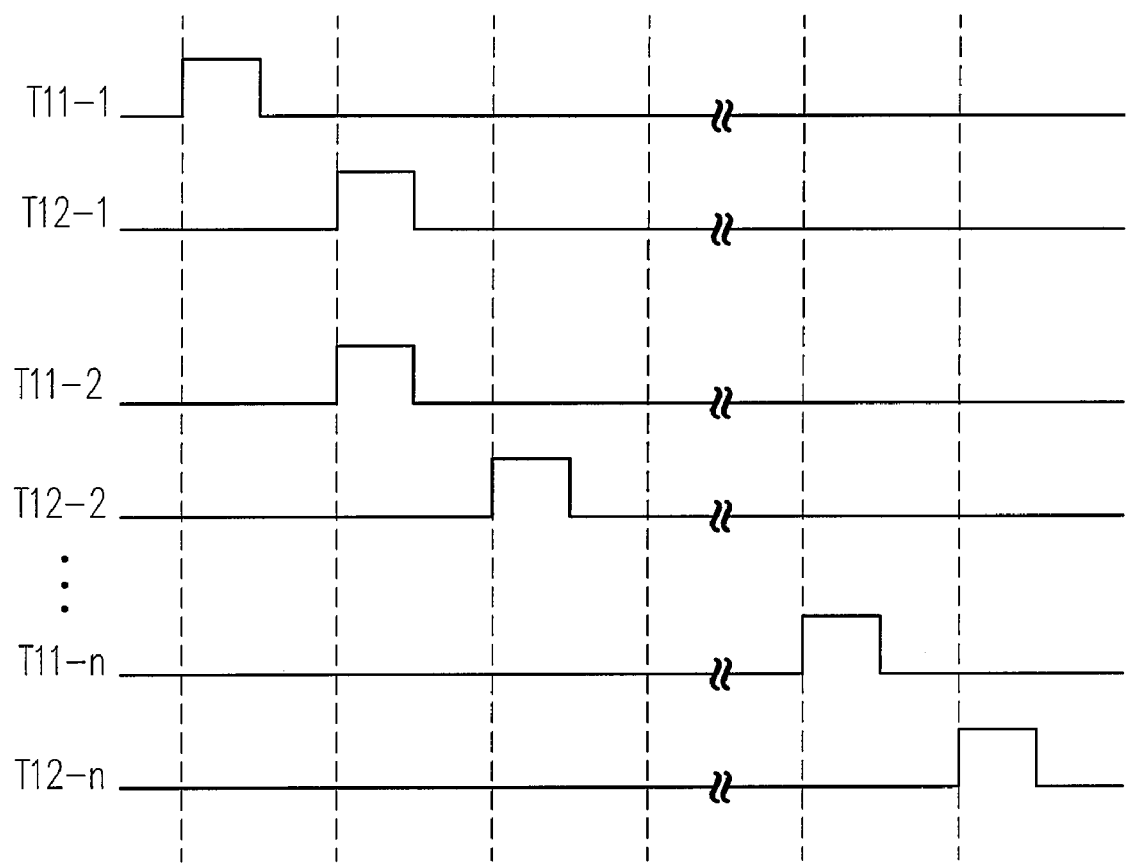
FIG. 1B illustrates a first control sequence of the switches of FIG. 1A.
Figure 1C:
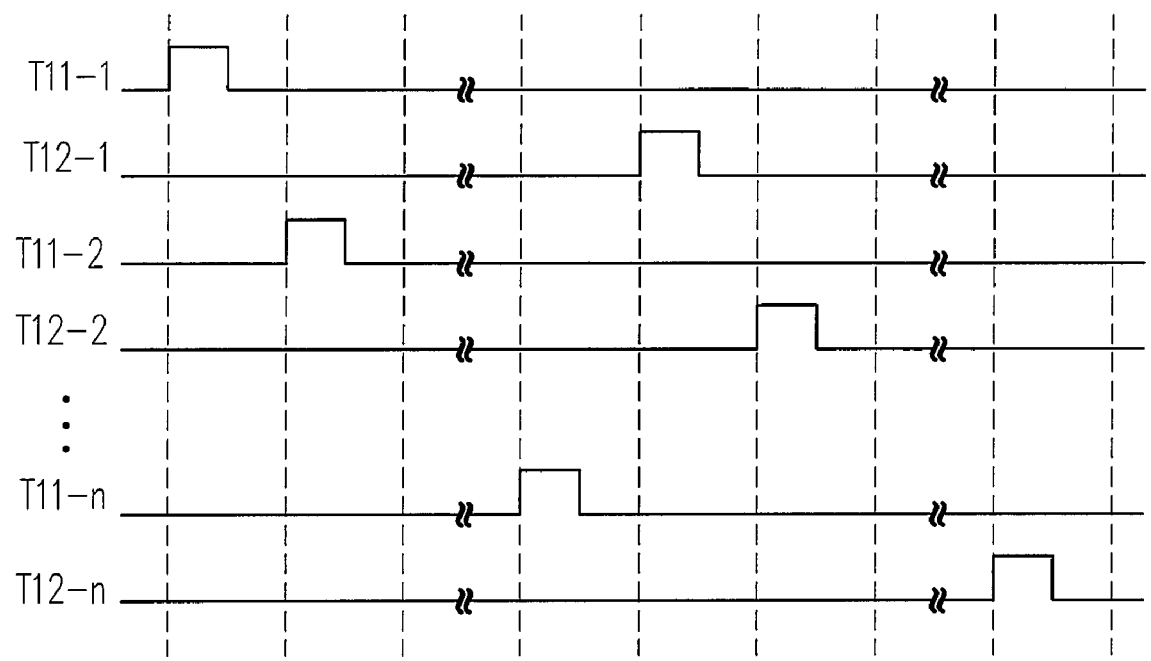
FIG. 1C illustrates a second control sequence of the switches of FIG. 1A.
Figure 2:
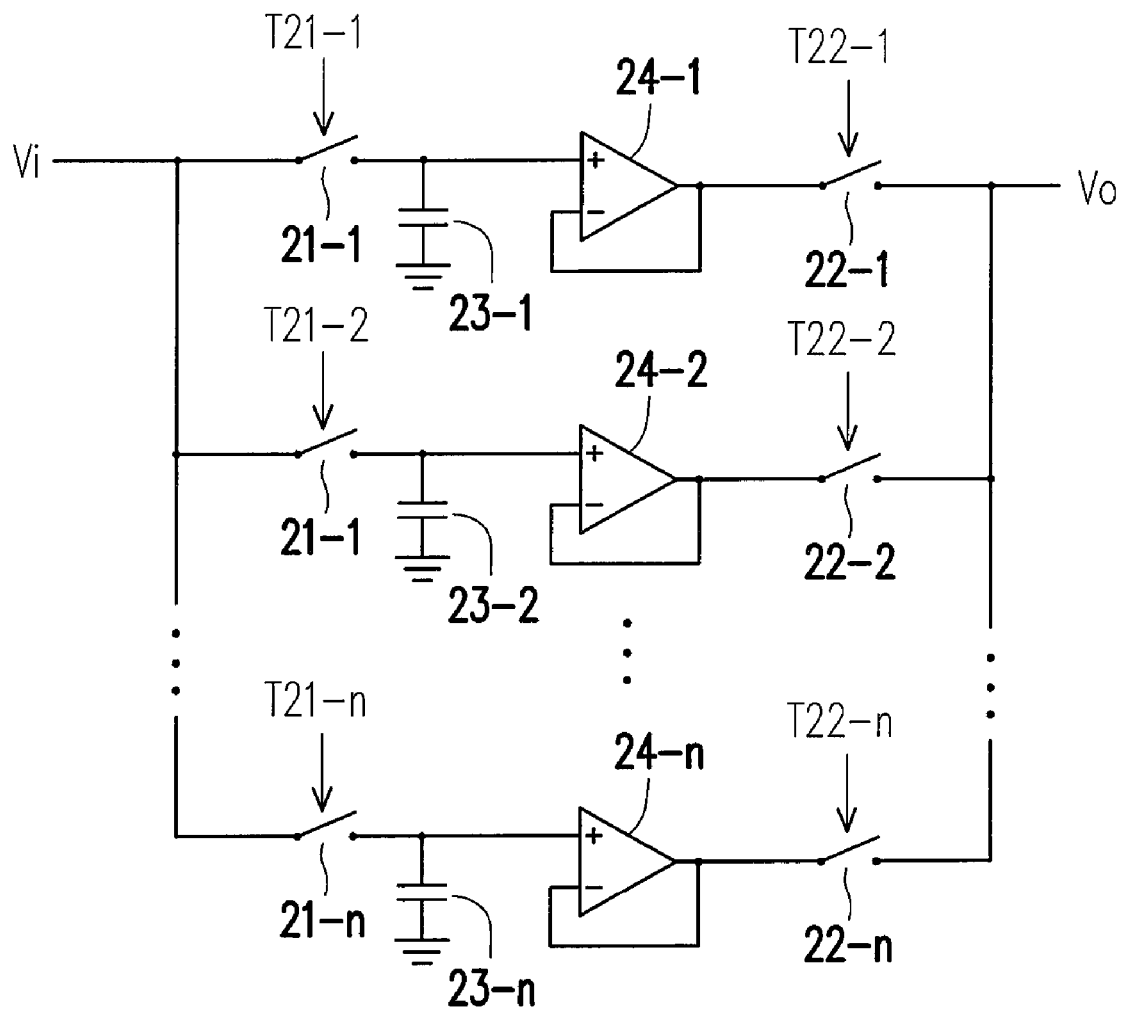
FIG. 2 illustrates a circuit diagram of another conventional sample-and-hold apparatus.
Figure 3:
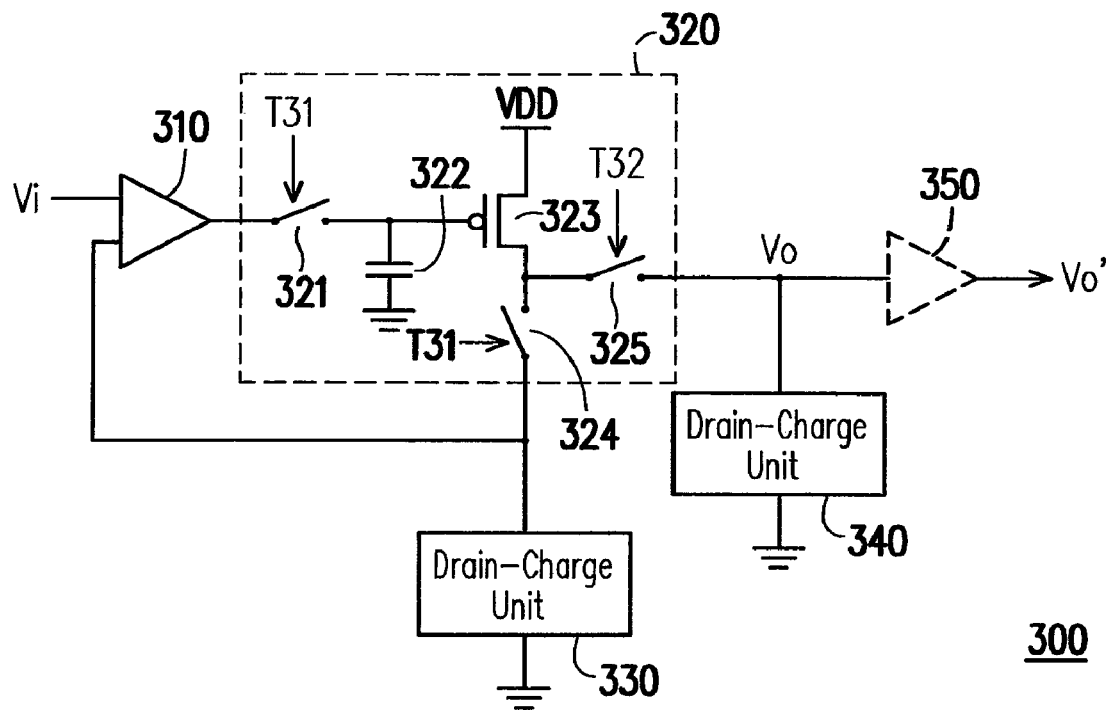
FIG. 3 is a circuit diagram of a sample-and-hold apparatus according to an embodiment of the present invention.

FIG. 3 is a circuit diagram of a sample-and-hold apparatus 300 according to an embodiment of the present invention. The sample-and-hold apparatus 300 includes a sampling amplifier 310, a sample-and-hold unit 320, a drain-charge unit 330, and a second drain-charge unit 340. The sample-and-hold unit 320 includes a P-channel metal oxide semiconductor (PMOS) transistor 323, a first switch 321, a second switch 324, a third switch 325, and a sampling capacitor 322.

Figure 4:
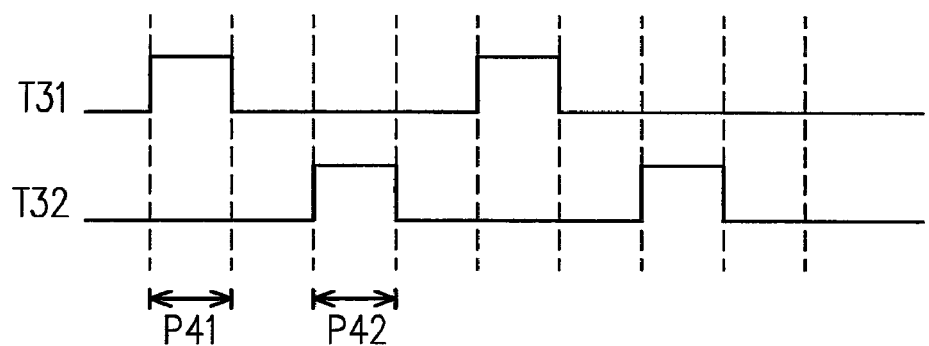
FIG. 4 is a time sequence diagram of the control signals of FIG. 3.

In this embodiment, the conducting states of the switches 321 and 324 are determined according to a control signal T31, and the conducting state of the switch 325 is determined according to a control signal T32. FIG. 4 is a time sequence diagram of the control signals T31 and T32 of FIG. 3. In FIG. 4, the high level indicates that the controlled switch is turned on, and the low level indicates that the controlled switch is turned off.

Referring to FIG. 3, a first input terminal (e.g., a negative input terminal) of the sampling amplifier (e.g., an operational amplifier) 310 receives an input signal Vi. The first switch 321 is coupled between an output terminal of the sampling amplifier 310 and a gate of the PMOS transistor 323. A first terminal of the sampling capacitor 322 is coupled to the gate of the PMOS transistor 323, and a second terminal of the sampling capacitor 322 is coupled to a reference voltage (e.g., the ground). A first terminal (e.g., the source) of the PMOS transistor 323 is coupled to a first voltage (e.g., the system voltage VDD), and a second terminal (e.g., the drain) of the PMOS transistor 323 is coupled to the first terminals of the switches 324 and 325. A second terminal of the second switch 324 is coupled to a second input terminal (e.g., a positive input terminal) of the sampling amplifier 310. A first terminal of the drain-charge unit 330 is coupled to the second terminal of the second switch 324, and a second terminal of the drain-charge unit 330 is coupled to a second voltage (e.g., the ground). A second terminal of the third switch 325 is coupled to a first terminal of the second drain-charge unit 340, and outputs a sampling result Vo. A second terminal of the second drain-charge unit 340 is coupled to a third voltage (e.g., the ground). According to an embodiment of the present invention, a buffer 350 can be added to the sample-and-hold apparatus 300 of the present invention according to user's requirements, so as to gain the thrust of the sampling result Vo, and output a sampling result Vo' to the circuit of next stage.

Figure 5A:
FIGS. 5A-5D show possible implementations of the drain-charge units according to the present invention.
Figure 5B:
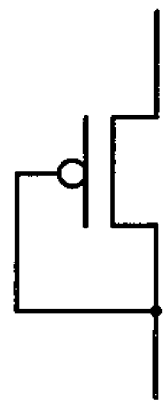
Figure 5C:
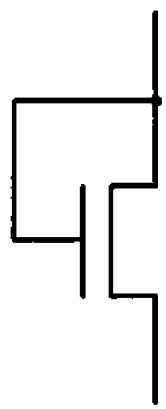
Figure 5D:
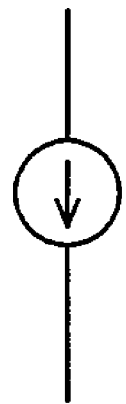

The drain-charge units 330 and 340 are used to drain or provide charges. FIGS. 5A-5D show possible implementations of the drain-charge units 330 and 340 according to the present invention. As shown in FIG. 5A, the drain-charge unit 330 or 340 can be a resistor, which has a first terminal and a second terminal serving as the first terminal and the second terminal of the drain-charge unit 330 or 340 respectively. As shown in FIG. 5B, the drain-charge unit 330 or 340 can be a PMOS transistor, which has a source and a drain serving as the first terminal and the second terminal of the drain-charge unit 330 or 340 respectively, and a gate connected with the drain. As shown in FIG. 5C, the drain-charge unit 330 or 340 can be an NMOS transistor, which has a drain and a source serving as the first terminal and the second terminal of the drain-charge unit 330 or 340 respectively, and a gate connected with the drain. As shown in FIG. 5D, the drain-charge unit 330 or 340 can also be a current source having a first terminal and a second terminal serving as the first terminal and the second terminal of the drain-charge unit 330 or 340 respectively. The sizes of the elements of the drain-charge units 330 and 340 can be different, so as to amplify or reduce the input signal Vi.

Referring to FIGS. 3 and 4 together, during the sampling period P41, the first switch 321 and the second switch 324 are turned on, and the third switch 325 is turned off. At this time, the output of the sampling amplifier 310 will charge the sampling capacitor 322 through the first switch 321. The transistor 323 determines the current amount flowing through its source and drain according to the voltage of the gate. The drain-charge unit 330 converts the current output from the drain of the transistor 323 into the voltage, and the voltage is fed back to the second input terminal of the sampling amplifier 310. Therefore, during the sampling period P41, the sampling amplifier 310, the sample-and-hold unit 320, and the drain-charge unit 330 are equivalent to one voltage follower, such that the voltage of the drain of the transistor 323 is approximately equal to the input signal Vi. When the sampling period P41 is over, the first switch 321 and the second switch 324 will restore the OFF state. Therefore, the sampling result of the input signal Vi is held in the sampling capacitor 322.

During the output period P42, the first switch 321 and the second switch 324 remain in the OFF state, and the third switch 325 is turned on. At this time, the transistor 323 and the drain-charge unit 340 are connected in series between the system voltage VDD and the ground. Therefore, the sample-and-hold unit 320 can output the sampling result Vo to the circuit of next stage.

Figure 6:
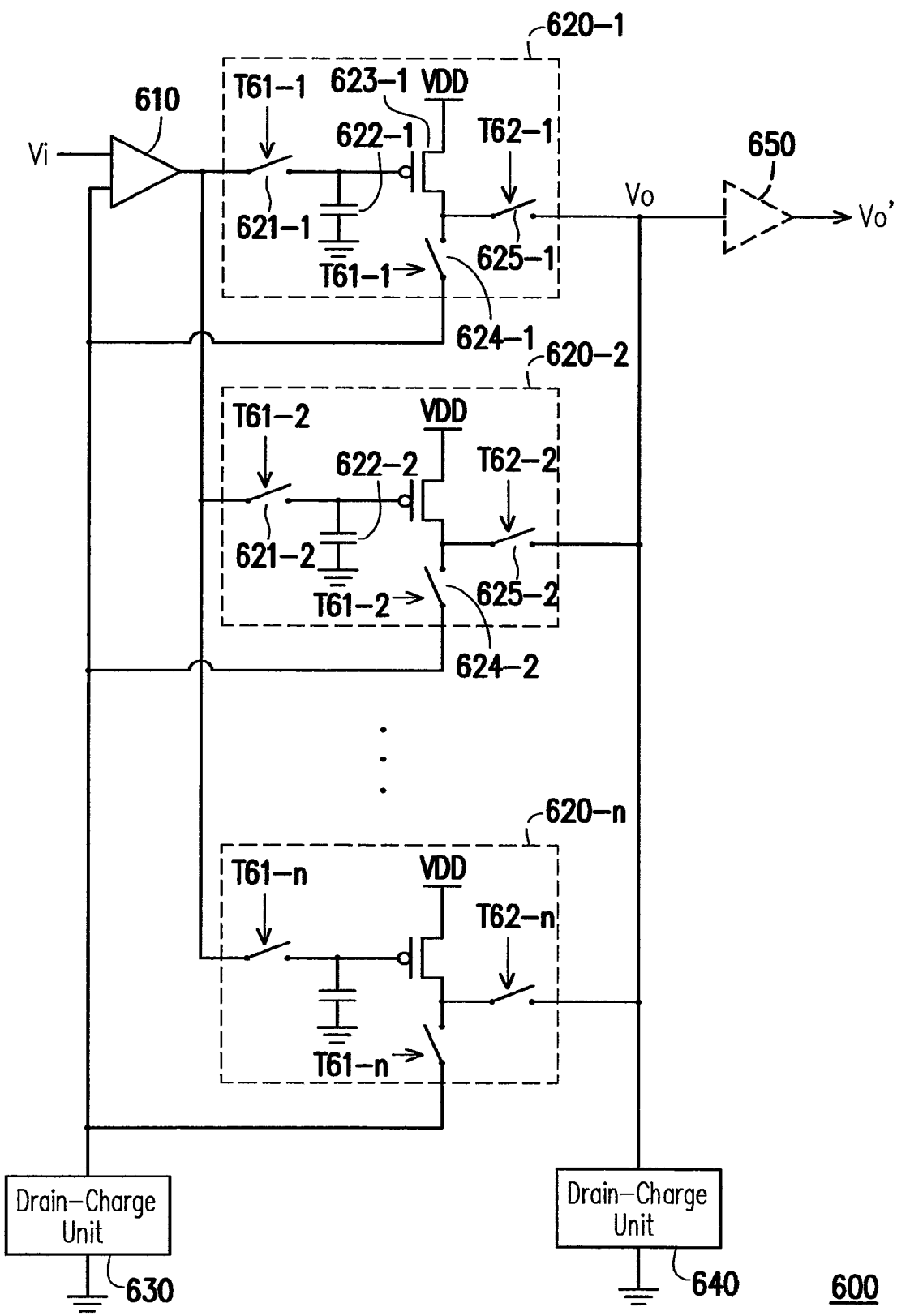
FIG. 6 shows a sample-and-hold apparatus having a plurality of sets of sample-and-hold units according to an embodiment of the present invention.

Persons of ordinary skill in the art can make proper modifications to the above embodiment according to actual requirements. For example, FIG. 6 shows a sample-and-hold apparatus having a plurality of sets of sample-and-hold units according to an embodiment of the present invention. Referring to FIG. 6, the sample-and-hold apparatus 600 includes a sampling amplifier 610, sample-and-hold units 620-1 to 620-n, a drain-charge unit 630, and a second drain-charge unit 640. A first input terminal of the sampling amplifier 610 receives an input signal Vi. The drain-charge units 630 and 640 drain/provide charges, and can be implemented with reference to FIGS. 5A-5D. A first terminal of the drain-charge unit 630 is coupled to the second input terminal of the sampling amplifier 610, and a second terminal of the drain-charge unit 630 is coupled to the first voltage (e.g., the ground).

Figure 7A:
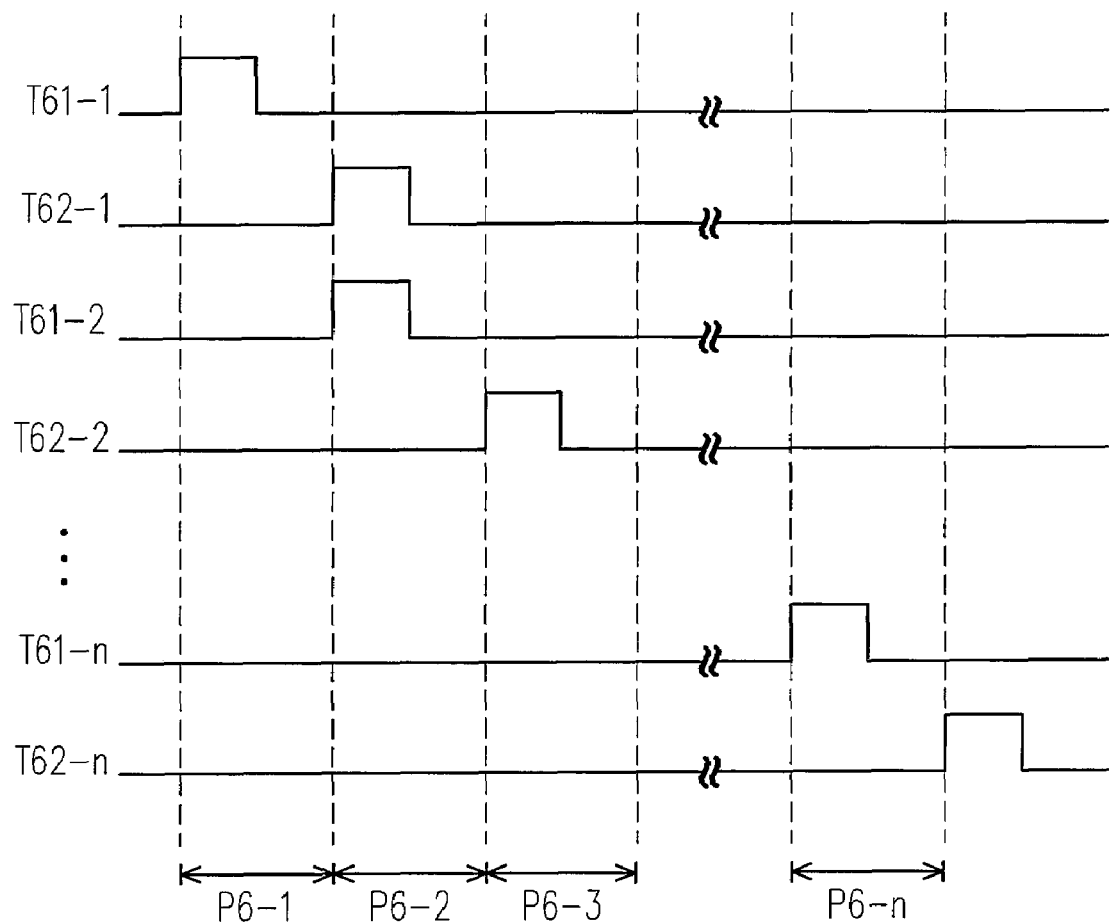
FIG. 7A is a time sequence diagram of the control signals of the switches of FIG. 6 according to an embodiment of the present invention.

The n sample-and-hold units 620-1 to 620-n can be implemented as the sample-and-hold unit 320 of FIG. 3, and the details will not be described herein. In this embodiment, the switches in the sample-and-hold units 620-1 to 620-n are controlled by control signals T61-1 to T61-n and T62-1 to T62-n respectively. FIG. 7A is a time sequence diagram of the control signals of the switches of FIG. 6 according to an embodiment of the present invention. In FIG. 7A, the high level indicates that the controlled switch is turned on, and the low level indicates that the controlled switch is turned off.

Referring to FIGS. 6 and 7A together, during the first period P6-1, the first switch 621-1 and the second switch 624-1 of the first sample-and-hold unit 620-1 are turned on, and the first switches and the second switches of other sample-and-hold units are turned off. At this time, the output of the sampling amplifier 610 will charge the sampling capacitor 622-1 through the first switch 621-1.

When the second period P6-2, the first switch 621-2 and the second switch 624-2 of the second sample-and-hold unit 620-2 are turned on, and the first switches and the second switches of other sample-and-hold units are turned off. At this time, the output of the sampling amplifier 610 will charge the sampling capacitor 622-2 through the first switch 621-2. In addition, the third switch 625-1 in the first sample-and-hold unit 620-1 is turned on during the second period P6-2 (at this time, the third switches of other sample-and-hold units are turned off). At this time, the transistor 623-1 and the drain-charge unit 640 are connected in series between the system voltage VDD and the ground. Therefore, the sample-and-hold unit 620-1 will output the sampling result Vo to the circuit of next stage according to the charges stored in the sampling capacitor 622-1 in advance.

The operations from the third period P6-3 to the nth period P6-n can be deduced from the above description. That is, during the Ith period, the first switch and the second switch in the Ith sample-and-hold unit are turned on, and the first switches and the second switches of other sample-and-hold units are turned off. In the Ith period, the third switch of the $(I-1)^{th}$ sample-and-hold unit is turned on, and the third switches of other sample-and-hold units are turned off.

Therefore, the sample-and-hold units 620-1 to 620-n can sequentially output the previous sampling results to the circuit of next stage according to the time sequence of FIG. 7A. According to requirements of users, a buffer 650 can be added to the sample-and-hold apparatus 600 of the present invention, so as to gain the thrust of the sampling result Vo and output a sampling result Vo' to the circuit of next stage.

Figure 7B:
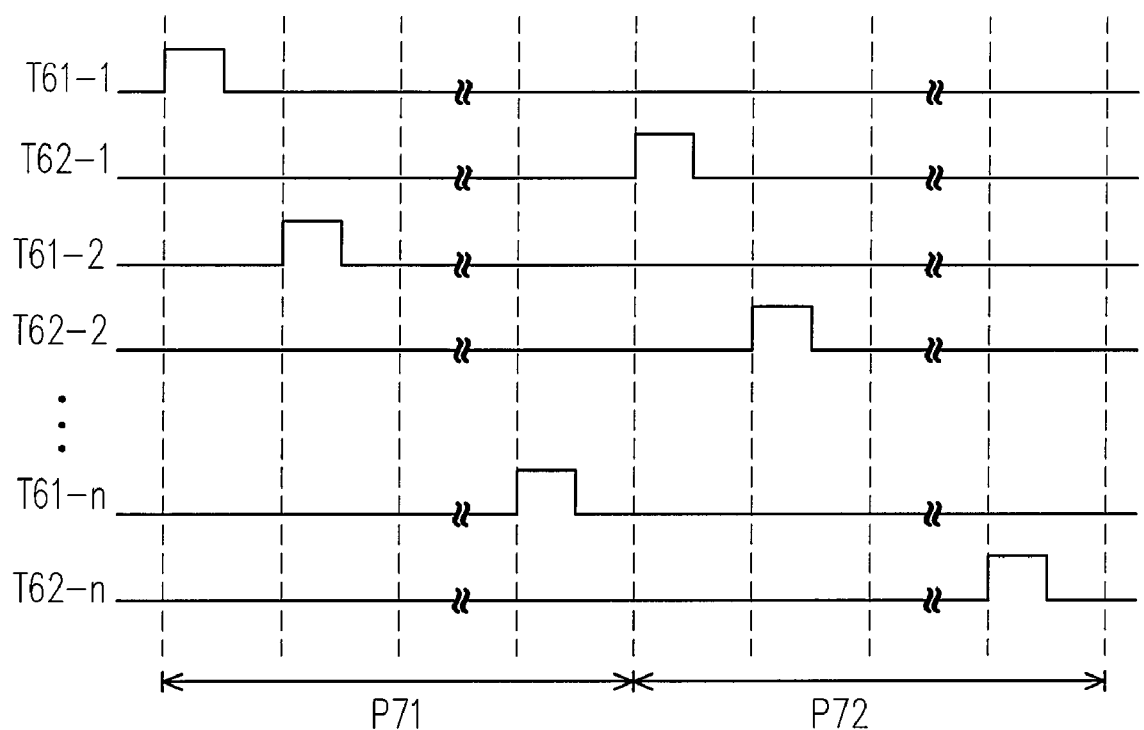
FIG. 7B is a time sequence diagram of the control signals of the switches of FIG. 6 according to another embodiment of the present invention.

The operating method of the sample-and-hold apparatus 600 is not limited to the above embodiment, and other methods can also be used as long as the signals are sampled and stored in the corresponding sampling capacitors before the signals are read out. The present invention can be realized with other operating methods according to requirements of users. For example, FIG. 7B is a time sequence diagram of the control signals of the switches of FIG. 6 according to another embodiment of the present invention, in which all signals are sampled and stored in corresponding sampling capacitors and then output. In FIG. 7B, the high level indicates that the controlled switch is turned on, and the low level indicates that the controlled switch is turned off.

During the sampling period P71, the control signals T62-1 to T62-n turn off the third switches of the sample-and-hold units 620-1 to 620-n. During the first sub-period of the sampling period P71, through the control signal T61-1, the first switch 621-1 and the second switch 624-1 of the first sample-and-hold unit 620-1 are turned on, and the first switches and the second switches of other sample-and-hold units are turned off. At this time, the output of the sampling amplifier 610 will charge the sampling capacitor 622-1 through the first switch 621-1. During the second sub-period of the sampling period P71, through the control signal T61-2, the first switch 621-2 and the second switch 624-2 of the second sample-and-hold unit 620-2 are turned on, and the first switches and the second switches of other sample-and-hold units are turned off.

At this time, the output of the sampling amplifier 610 will charge the sampling capacitor 622-2 through the first switch 621-2. The operations during the third to the nth sub-periods in the sampling period P71 can be deduced from the above description.

That is, during the Ith sub-period of the sampling period, the first switch and the second switch of the Ith sample-and-hold unit are turned on, the first switches and the second switches of other sample-and-hold units are turned off, and the third switch of each of the sample-and-hold units is turned off.

During the output period P72, through the control signals T61-1 to T61-n, the first switches and the second switches of the sample-and-hold units 620-1 to 620-n are turned off. During the first sub-period of the output period P72, the third switch 625-1 of the first sample-and-hold unit 620-1 is turned on, and the third switches of other sample-and-hold units are turned off. At this time, the transistor 623-1 and the drain-charge unit 640 are connected in series between the system voltage VDD and the ground. Therefore, the sample-and-hold unit 620-1 will output the sampling result Vo to the circuit of next stage according to the charges stored in the sampling capacitor 622-1 in advance. During the second sub-period of the output period P72, the third switch 625-2 of the second sample-and-hold unit 620-2 is turned on, and the third switches of other sample-and-hold units are turned off. The operations during the third to the nth sub-periods in the output period P72 can be deduced from the above description. That is, during the Ith sub-period of the output period, the third switch of the Ith sample-and-hold unit is turned on, the third switches of other sample-and-hold units are turned off, and the first switch and the second switch in each of the sample-and-hold units are turned off.

Figure 8:
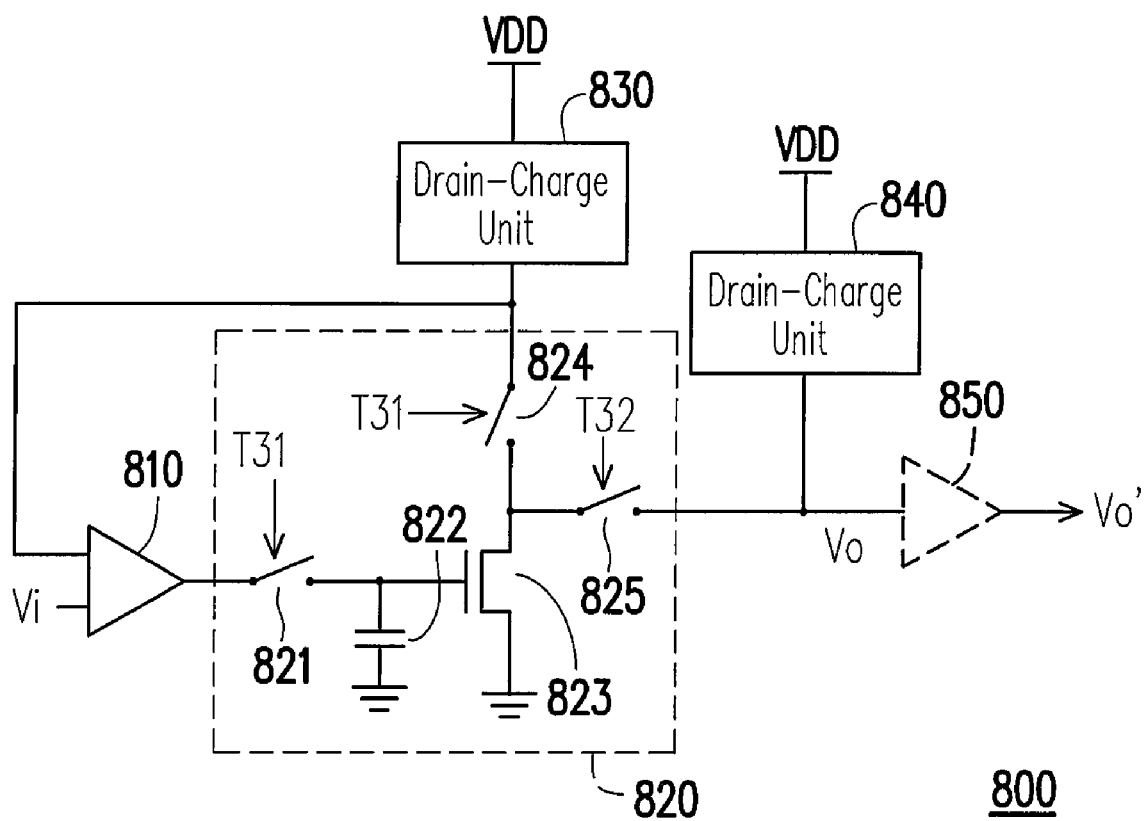
FIG. 8 is a circuit diagram of a sample-and-hold apparatus according to another embodiment of the present invention.

Persons of ordinary skill in the art can make proper modifications to the above embodiment according to actual requirements. For example, FIG. 8 is a circuit diagram of a sample-and-hold apparatus according to another embodiment of the present invention. The sample-and-hold apparatus 800 includes a sampling amplifier 810, a sample-and-hold unit 820, a drain-charge unit 830, and a second drain-charge unit 840. The sample-and-hold unit 820 includes an N-channel metal oxide semiconductor (NMOS) transistor 823, a first switch 821, a second switch 824, a third switch 825, and a sampling capacitor 822. In this embodiment, the conducting states of the switches 821 and 824 are determined according to a control signal T31, and the conducting state of the switch 825 is determined according to a control signal T32. The time sequence of the control signals T31 and T32 can be implemented with reference to FIG. 4.

Referring to FIG. 8, a first input terminal (e.g., a negative input terminal) of the sampling amplifier (e.g., an operational amplifier) 810 receives an input signal Vi. The first switch 821 is coupled between an output terminal of the sampling amplifier 810 and a gate of the NMOS transistor 823. A first terminal of the sampling capacitor 822 is coupled to the gate of the NMOS transistor 823, and a second terminal of the sampling capacitor 822 is coupled to a reference voltage (e.g., the ground). A first terminal (e.g., the source) of the NMOS transistor 823 is coupled to the first voltage (e.g., the ground), and a second terminal (e.g., the drain) of the NMOS transistor 823 is coupled to the first terminals of the switches 824 and 825. A second terminal of the second switch 824 is coupled to a second input terminal (e.g., a positive input terminal) of the sampling amplifier 810. A first terminal of the drain-charge unit 830 is coupled to the second terminal of the second switch 824, and a second terminal of the drain-charge unit 830 is coupled to a second voltage (e.g., the system voltage VDD). A second terminal of the third switch 825 is coupled to a first terminal of the second drain-charge unit 840, and outputs the sampling result Vo. A second terminal of the second drain-charge unit 840 is coupled to the third voltage (e.g., the system voltage VDD). The drain-charge units 830 and 840 are used to drain or provide charges, and can be implemented with reference to FIGS. 5A-5D. According to requirements of users of the present invention, a buffer 850 can be added to the sample-and-hold apparatus 800 of the present invention, so as to gain the thrust of the sampling result Vo, and output a sampling result Vo' to the circuit of next stage.

Referring to FIGS. 4 and 8 together, during the sampling period P41, the first switch 821 and the second switch 824 are turned on, and the third switch 825 is turned off. At this time, the output of the sampling amplifier 810 will charge the sampling capacitor 822 through the first switch 821. The transistor 823 determines the current amount flowing through its source and drain according to the voltage of the gate. The drain-charge unit 830 converts the current output from the drain of the transistor 823 into the voltage, and the voltage is then fed back to the second input terminal of the sampling amplifier 810. Therefore, during the sampling period P41, the sampling amplifier 810, the sample-and-hold unit 820, and the drain-charge unit 830 are equivalent to one voltage follower, such that the voltage of the drain of the transistor 823 is approximately equal to the input signal Vi. When the sampling period P41 is over, the first switch 821 and the second switch 824 will restore the OFF state. Therefore, the sampling result of the input signal Vi is held in the sampling capacitor 822.

During the output period P42, the first switch 821 and the second switch 824 remain in the OFF state, and the third switch 825 is turned on. At this time, the drain-charge unit 840 and the transistor 823 are connected in series between the system voltage VDD and the ground. Therefore, the sample-and-hold unit 820 will output the sampling result Vo to the circuit of next stage.

Figure 9:
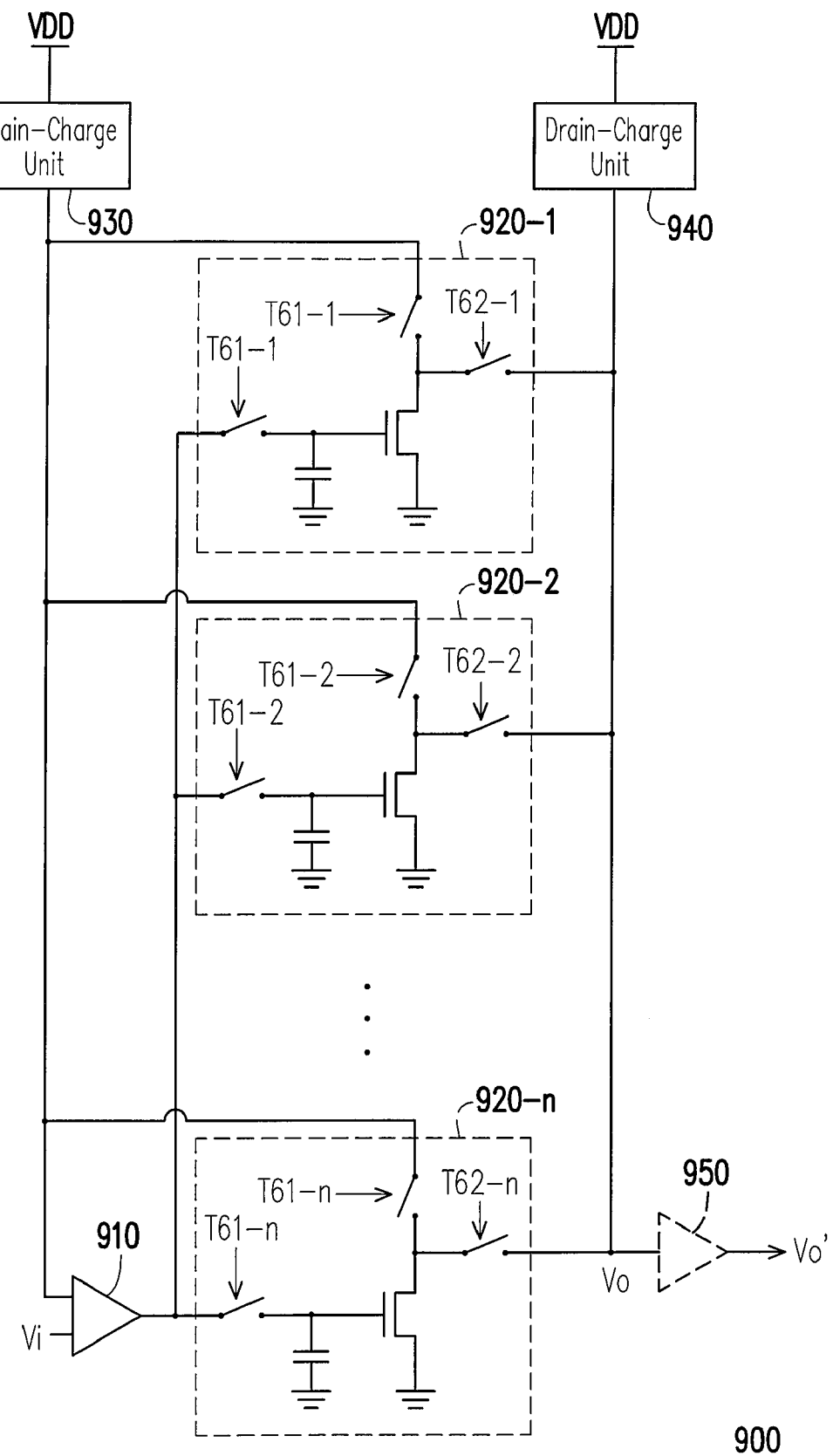
FIG. 9 shows another sample-and-hold apparatus having a plurality of sets of sample-and-hold units according to an embodiment of the present invention.

Persons of ordinary skill in the art can make proper modifications to the above embodiment according to actual requirements. For example, FIG. 9 shows another sample-and-hold apparatus having a plurality of sets of sample-and-hold units according to an embodiment of the present invention. Referring to FIG. 9, the sample-and-hold apparatus 900 includes a sampling amplifier 910, sample-and-hold units 920-1 to 920-n, a drain-charge unit 930, and a second drain-charge unit 940. A first input terminal of the sampling amplifier 910 receives an input signal Vi. The drain-charge units 930 and 940 are used to drain/provide charges, and can be implemented with reference to FIGS. 5A-5D. A first terminal of the drain-charge unit 930 is coupled to the second input terminal of the sampling amplifier 910, and a second terminal of the drain-charge unit 930 is coupled to the first voltage (e.g., the system voltage VDD).

The n sample-and-hold units 920-1 to 920-n can be implemented as the sample-and-hold unit 820 of FIG. 8, and the details will not be described herein. In this embodiment, the switches in the sample-and-hold units 920-1 to 920-n are controlled by control signals T61-1 to T61-n and T62-1 to T62-n respectively. The time sequence control of the control signals T61-1 to T61-n and T62-1 to T62-n can be implemented with reference to FIG. 7A, FIG. 7B or to other control methods. Therefore, the sample-and-hold units 920-1 to 920-n can output the previous sampling results Vo to the circuit of next stage one by one according to the time sequence. According to requirements of users of the present invention, a buffer 950 can be added to the sample-and-hold apparatus 900 of the present invention, so as to gain the thrust of the sampling result Vo, and output a sampling result Vo' to the circuit of next stage.

Figure 10:
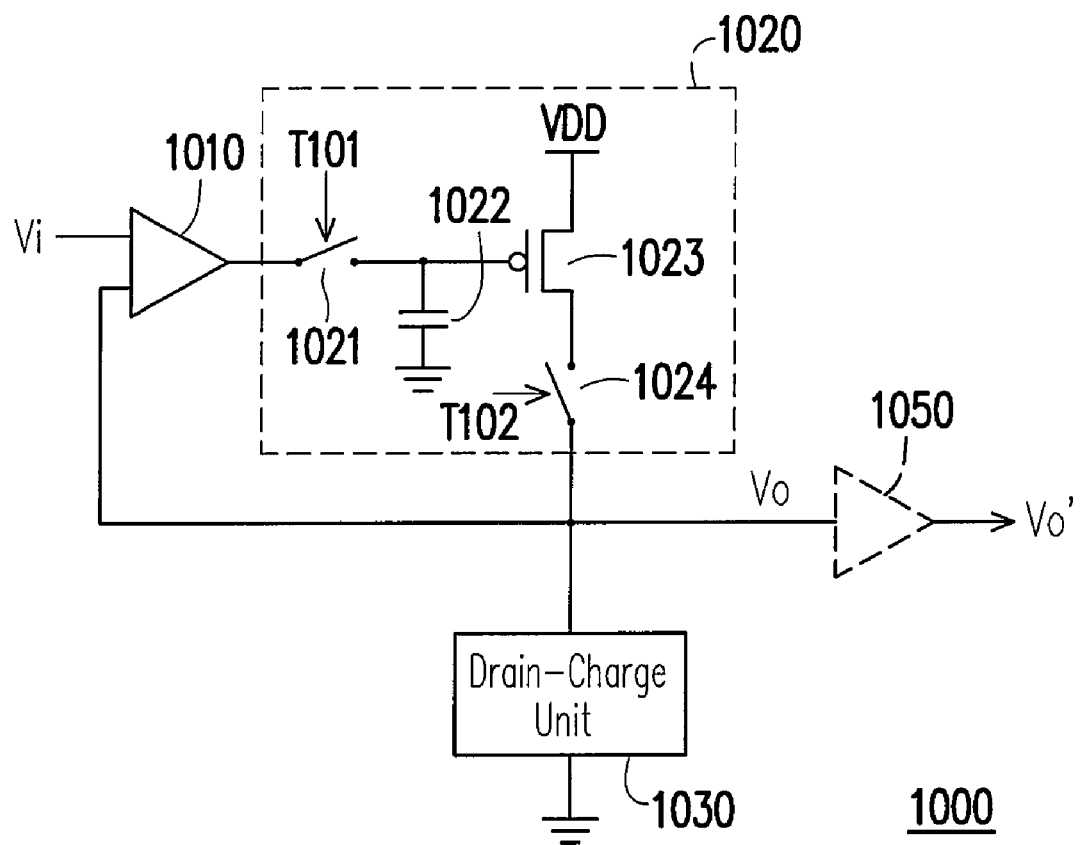
FIG. 10 is a circuit diagram of a sample-and-hold apparatus according to another embodiment of the present invention.

Persons of ordinary skill in the art can make proper modifications to the above embodiment according to actual requirements. For example, FIG. 10 is a circuit diagram of a sample-and-hold apparatus 1000 according to another embodiment of the present invention. The sample-and-hold apparatus 1000 includes a sampling amplifier 1010, a sample-and-hold unit 1020 and a drain-charge unit 1030. The sample-and-hold unit 1020 includes a PMOS transistor 1023, a first switch 1021, a second switch 1024 and a sampling capacitor 1022.

Referring to FIG. 10, a first input terminal (e.g., a negative input terminal) of the sampling amplifier (e.g., an operational amplifier) 1010 receives an input signal Vi. The first switch 1021 is coupled between an output terminal of the sampling amplifier 1010 and a gate of the PMOS transistor 1023. A first terminal of the sampling capacitor 1022 is coupled to the gate of the PMOS transistor 1023, and a second terminal of the sampling capacitor 1022 is coupled to a reference voltage (e.g., the ground). A first terminal (e.g., the source) of the PMOS transistor 1023 is coupled to a first voltage (e.g., the system voltage VDD), and a second terminal (e.g., the drain) of the PMOS transistor 1023 is coupled to the first terminals of the switches 1024 and 1025. A second terminal of the second switch 1024 is coupled to a second input terminal (e.g., a positive input terminal) of the sampling amplifier 1010. A first terminal of the drain-charge unit 1030 is coupled to the second terminal of the second switch 1024, and outputs a sampling result Vo to the circuit of next stage. A second terminal of the drain-charge unit 1030 is coupled to a second voltage (e.g., the ground). In this embodiment, the drain-charge unit 1030 can be implemented with reference to FIGS. 5A-5D, so as to drain or provide charges. According to requirements of users, a buffer 1050 can be added to the sample-and-hold apparatus 1000 of the present invention, so as to gain the thrust of the sampling result Vo, and output a sampling result Vo' to the circuit of next stage.

Figure 11:
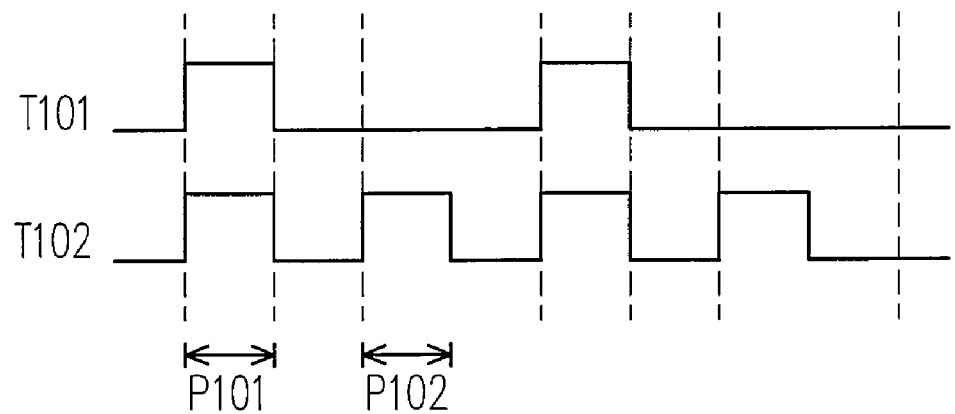
FIG. 11 is a time sequence diagram of the control signals of FIG. 10.

In this embodiment, the conducting state of the switch 1021 is determined according to a control signal T101, and the conducting state of the switch 1024 is determined according to a control signal T102. The time sequence of the control signals T101 and T102 can be implemented with reference to FIG. 11. FIG. 11 is a time sequence diagram of the control signals T101 and T102 of FIG. 10. In FIG. 11, the high level indicates that the controlled switch is turned on, and the low level indicates that the controlled switch is turned off.

Referring to FIGS. 10 and 11 together, during the sampling period P101, the first switch 1021 and the second switch 1024 are turned on. At this time, the output of the sampling amplifier 1010 will charge the sampling capacitor 1022 through the first switch 1021. The transistor 1023 determines the current amount flowing through its source and drain according to the voltage of the gate. The drain-charge unit 1030 converts the current output from the drain of the transistor 1023 into the voltage, and the voltage is fed back to the second input terminal of the sampling amplifier 1010. Therefore, during the sampling period P101, the sampling amplifier 1010, the sample-and-hold unit 1020, and the drain-charge unit 1030 are equivalent to one voltage follower, such that the voltage of the drain of the transistor 1023 is approximately equal to the input signal Vi. When the sampling period P101 is over, the first switch 1021 and the second switch 1024 will restore the OFF state. Therefore, the sampling result of the input signal Vi is held in the sampling capacitor 1022.

During the output period P102, the first switch 1021 remains in the OFF state, and the second switch 1024 is turned on. At this time, the transistor 1023 and the drain-charge unit 1030 are connected in series between the system voltage VDD and the ground. Therefore, due to the voltage division effect of the transistor 1023 and the drain-charge unit 1030, the sampling result Vo is output to the circuit of next stage.

Figure 12:
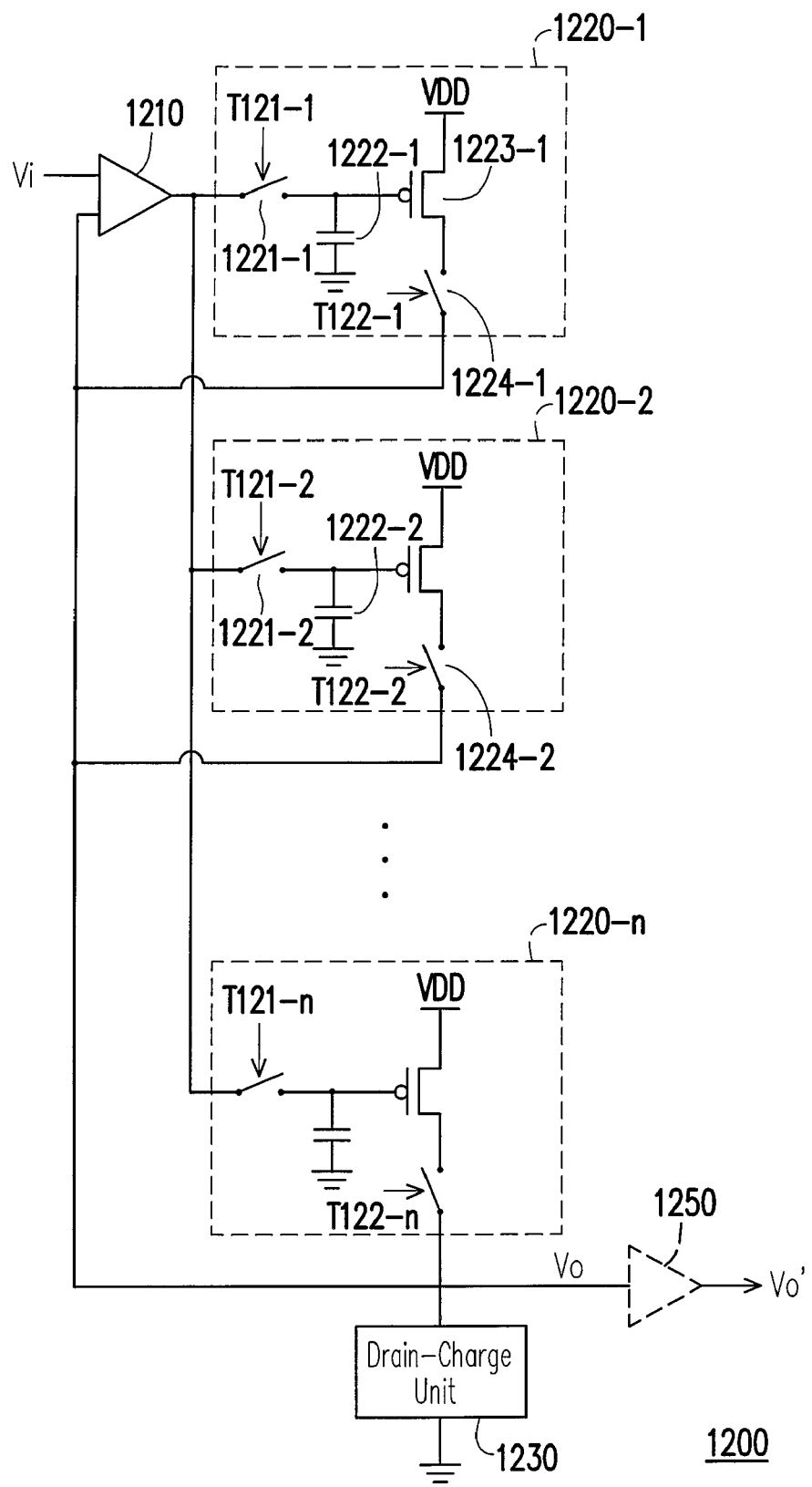
FIG. 12 shows a sample-and-hold apparatus having a plurality of sets of sample-and-hold units according to another embodiment of the present invention.

Persons of ordinary skill in the art can make proper modifications to the above embodiment according to actual requirements. For example, FIG. 12 shows a sample-and-hold apparatus having a plurality of sets of sample-and-hold units according to another embodiment of the present invention. Referring to FIG. 12, the sample-and-hold apparatus 1200 includes a sampling amplifier 1210, sample-and-hold units 1220-1 to 1220-n, and a drain-charge unit 1230. A first input terminal of the sampling amplifier 1210 receives an input signal Vi. The drain-charge unit 1220 is used to drain/provide charges, and can be implemented with reference to FIGS. 5A-5D. A first terminal of the drain-charge unit 1230 is coupled to the second input terminal of the sampling amplifier 1210, and a second terminal of the drain-charge unit 1230 is coupled to the first voltage (e.g., the ground).

Figure 13:
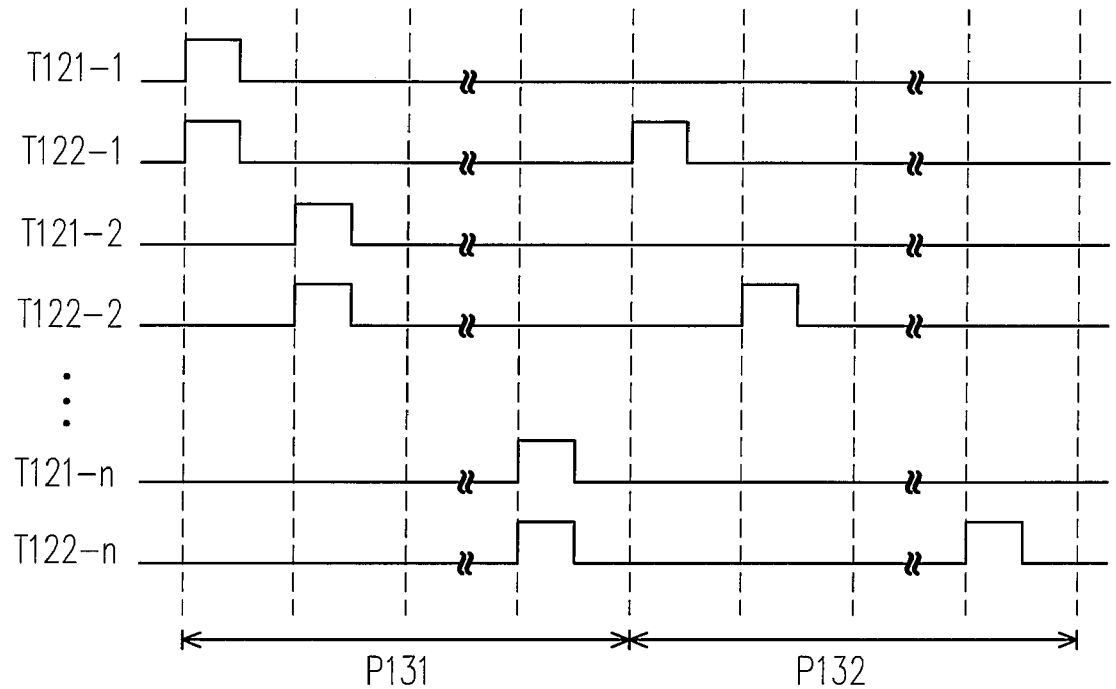
FIG. 13 is a time sequence diagram of the control signals of the switches of FIG. 12 according to the present invention.

The n sample-and-hold units 1220-1 to 1220-n can be implemented with reference to the sample-and-hold unit 1020 of FIG. 10, and the details will not be described herein. In this embodiment, the switches of the sample-and-hold units 1220-1 to 1220-n are controlled by control signals T121-1 to T121-n and control signals T122-1 to T122-n respectively. FIG. 13 is a time sequence diagram of the control signals of the switches of FIG. 12 according to the present invention. In FIG. 13, the high level indicates that the controlled switch is turned on, and the low level indicates that the controlled switch is turned off.

Referring to FIGS. 12 and 13 together, during the first sub-period of the sampling period P131, through the control signals T121-1 and T122-1, the first switch 1221-1 and the second switch 1224-1 of the first sample-and-hold unit 1220-1 are turned on, and the first switches and the second switches of other sample-and-hold units are turned off. At this time, the output of the sampling amplifier 1210 will charge the sampling capacitor 1222-1 through the first switch 1221-1.

During the second sub-period of the sampling period P131, through the control signals T121-2 and T122-2, the first switch 1221-2 and the second switch 1224-2 of the second sample-and-hold unit 1220-2 are turned on, and the first switches and the second switches of other sample-and-hold units are turned off. At this time, the output of the sampling amplifier 1210 will charge the sampling capacitor 1222-2 through the first switch 1221-2.

The operations during the third to the nth sub-periods of the sampling period P131 can be deduced from the above description. That is, during an Ith sub-period of the sampling period, the first switch and the second switch of an Ith sample-and-hold unit are turned on, and the first switches and the second switches of other sample-and-hold units are turned off.

During the output period P132, through the control signals T121-1 to T121-n, the first switches of the sample-and-hold units 1220-1 to 1220-n are turned off. During the first sub-period of the output period P132, the second switch 1224-1 of the first sample-and-hold unit 1220-1 is turned on, and the second switches of other sample-and-hold units are turned off. At this time, the transistor 1223-1 and the drain-charge unit 1230 are connected in series between the system voltage VDD and the ground. Therefore, the sample-and-hold unit 1220-1 can output the sampling result Vo to the circuit of next stage according to the charges stored in the sampling capacitor 1222-1 in advance.

During the second sub-period of the output period P132, the second switch 1224-2 of the second sample-and-hold unit 1220-2 is turned on, and the second switches of other sample-and-hold units are turned off. The operations during the third to the nth sub-periods in the output period P132 can be deduced from the above description. That is, during an Ith sub-period of the output period, the second switch of the Ith sample-and-hold unit is turned on, the second switches of other sample-and-hold units are turned off, and the first switches of all sample-and-hold units are turned off.

Figure 14:
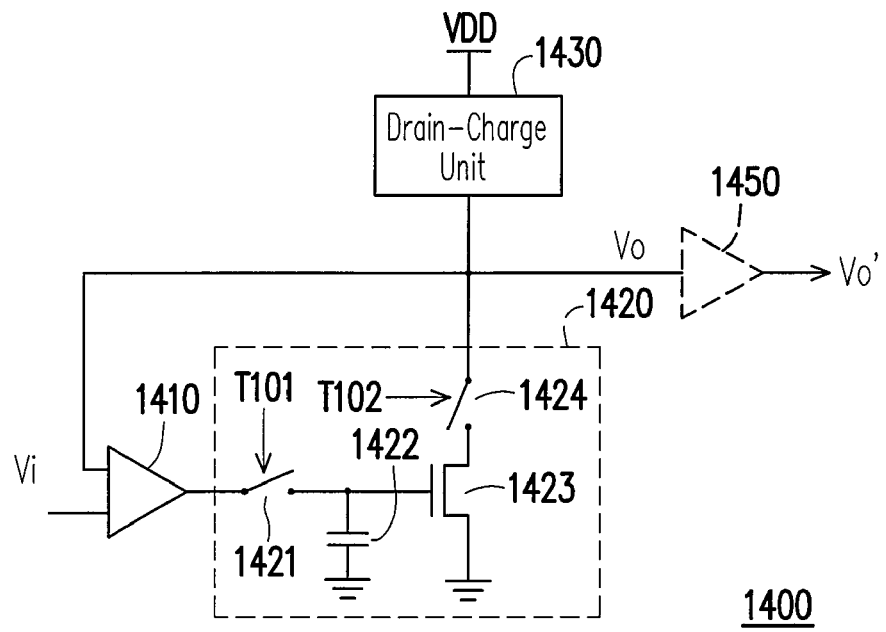
FIG. 14 is a circuit diagram of a sample-and-hold apparatus according to another embodiment of the present invention.

Persons of ordinary skill in the art can make proper modifications to the above embodiment according to actual requirements. For example, FIG. 14 is a circuit diagram of a sample-and-hold apparatus according to another embodiment of the present invention. The sample-and-hold apparatus 1400 includes a sampling amplifier 1410, a sample-and-hold unit 1420, and a drain-charge unit 1430. The sample-and-hold unit 1420 includes an NMOS transistor 1423, a first switch 1421, a second switch 1424, and a sampling capacitor 1422.

Referring to FIG. 14, a first input terminal (e.g., a negative input terminal) of the sampling amplifier (e.g., an operational amplifier) 1410 receives an input signal Vi. The first switch 1421 is coupled between an output terminal of the sampling amplifier 1410 and a gate of the NMOS transistor 1423. A first terminal of the sampling capacitor 1422 is coupled to the gate of the NMOS transistor 1423, and a second terminal of the sampling capacitor 1422 is coupled to a reference voltage (e.g., the ground). A first terminal (e.g., the source) of the NMOS transistor 1423 is coupled to the first voltage (e.g., the ground), and a second terminal (e.g., the drain) of the NMOS transistor 1423 is coupled to the first terminal of the switch 1424. A second terminal of the second switch 1424 is coupled to a second input terminal (e.g., a positive input terminal) of the sampling amplifier 1410. A first terminal of the drain-charge unit 1430 is coupled to the second terminal of the second switch 1424 and outputs the sampling result Vo, and a second terminal of the drain-charge unit 1430 is coupled to a second voltage (e.g., the system voltage VDD). The drain-charge unit 1430 is used to drain/provide charges, and can be implemented with reference to FIGS. 5A-5D. According to requirements of users, a buffer 1450 can be added to the sample-and-hold apparatus 1400 of the present invention, so as to gain the thrust of the sampling result Vo, and output a sampling result Vo' to the circuit of next stage.

In this embodiment, the conducting state of the switch 1421 is determined according to a control signal T101, and the conducting state of the switch 1424 is determined according to a control signal T102. The time sequence of the control signals T101 and T102 can be implemented with reference to FIG. 11.

Referring to FIGS. 14 and 11 together, during the sampling period P101, the first switch 1421 and the second switch 1424 are turned on. At this time, the output of the sampling amplifier 1410 will charge the sampling capacitor 1422 through the first switch 1421. The transistor 1423 determines the current amount flowing through its source and drain according to the voltage of the gate. The drain-charge unit 1430 converts the current output from the drain of the transistor 1423 into the voltage, and the voltage is fed back to the second input terminal of the sampling amplifier 1410. Therefore, during the sampling period P101, the sampling amplifier 1410, the sample-and-hold unit 1420, and the drain-charge unit 1430 are equivalent to one voltage follower, such that the voltage of the drain of the transistor 1423 is approximately equal to the input signal Vi. When the sampling period P101 is over, the first switch 1421 and the second switch 1424 will restore the OFF state. Therefore, the sampling result of the input signal Vi is held in the sampling capacitor 1422.

During the output period P102, the first switch 1421 remains in the OFF state, and the second switch 1424 is turned on. At this time, the drain-charge unit 1440 and the transistor 1423 are connected in series between the system voltage VDD and the ground. Therefore, the sample-and-hold unit 1420 will output the sampling result Vo to the circuit of next stage.

Figure 15:
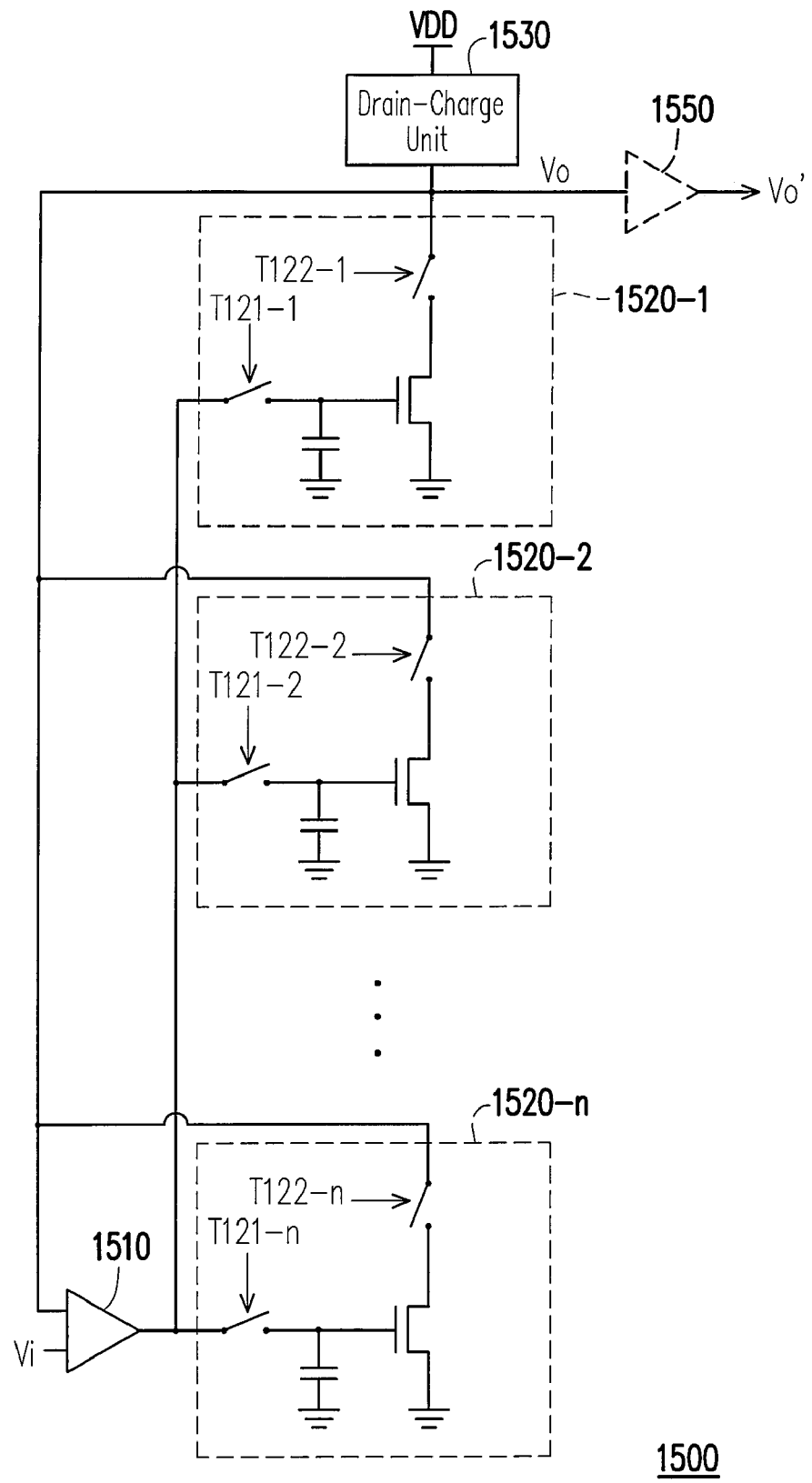
FIG. 15 shows another sample-and-hold apparatus having a plurality of sets of sample-and-hold units according to an embodiment of the present invention.

Persons of ordinary skill in the art can make proper modifications to the above embodiment according to actual requirements. For example, FIG. 15 shows another sample-and-hold apparatus having a plurality of sets of sample-and-hold units according to an embodiment of the present invention. Referring to FIG. 9, the sample-and-hold apparatus 1500 includes a sampling amplifier 1510, sample-and-hold units 1520-1 to 1520-n, and a drain-charge unit 1530. A first input terminal of the sampling amplifier 1510 receives an input signal Vi. The drain-charge unit 1530 is used to drain/provide charge, and can be implemented with reference to FIGS. 5A-5D. A first terminal of the drain-charge unit 1530 is coupled to the second input terminal of the sampling amplifier 1510, and a second terminal of the drain-charge unit 1530 is coupled to the first voltage (e.g., the system voltage VDD).

The n sample-and-hold units 1520-1 to 1520-n can be implemented with reference to the sample-and-hold unit 1420 of FIG. 14, and will not be described herein. In this embodiment, the switches in the sample-and-hold units 1520-1 to 1520-n are controlled by control signals T121-1 to T121-n and control signals T122-1 to T122-n respectively. The sequence control of the control signals T121-1 to T121-n and T122-1 to T122-n can be implemented with reference to FIG. 13 or to other control methods. Therefore, the sample-and-hold units 1520-1 to 1520-n can output the previous sampling results to the circuit of next stage one by one according to the time sequence. According to requirements of users, a buffer 1550 can be added to the sample-and-hold apparatus 1500 of the present invention, so as to gain the thrust of the sampling result Vo, and output a sampling result Vo' to the circuit of next stage.

To sum up, in the above embodiments, as the transistor is coupled to the sampling capacitor, the read switches are arranged on a path not influencing the voltage values of the sampling capacitor. Thus, the output distortion caused by the charge distribution effect is prevented. The signal is stored in the sampling capacitor by the use of the sampling amplifier, the switches, the sampling capacitor, the transistor, and the drain-charge units, and the sampling results stored in advance are read out by the transistor, the switches, and the drain-charge units. When the output thrust is insufficient, a buffer can be further connected in series.

It will be apparent to persons of ordinary art in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A sample-and-hold apparatus, comprising:
    a sampling amplifier, having a first input terminal receiving an input signal;
    a transistor, having a first terminal coupled to a first voltage;
    a first switch, coupled between an output terminal of the sampling amplifier and a gate of the transistor;
    a second switch, having a first terminal coupled to a second terminal of the transistor, and a second terminal coupled to a second input terminal of the sampling amplifier;
    a sampling capacitor, having a first terminal coupled to the gate of the transistor, and a second terminal coupled to a reference voltage; and
    a drain-charge unit, for draining or providing charges, having a first terminal coupled to the second terminal of the second switch, and a second terminal coupled to a second voltage.

2. The sample-and-hold apparatus as claimed in claim 1, further comprising:
    a third switch, having a first terminal coupled to the second terminal of the transistor; and
    a second drain-charge unit, having a first terminal coupled to a second terminal of the third switch, and a second terminal coupled to a third voltage.

3. The sample-and-hold apparatus as claimed in claim 2, wherein the third voltage is a ground voltage.

4. The sample-and-hold apparatus as claimed in claim 2, wherein the third voltage is a system voltage.

5. The sample-and-hold apparatus as claimed in claim 2, further comprising a buffer having an input terminal coupled to the second terminal of the third switch.

6. The sample-and-hold apparatus as claimed in claim 1, further comprising a buffer having an input terminal coupled to the second terminal of the second switch.

7. The sample-and-hold apparatus as claimed in claim 1, wherein the drain-charge unit comprises a resistor having a first terminal and a second terminal serving as the first terminal and the second terminal of the drain-charge unit respectively.

8. The sample-and-hold apparatus as claimed in claim 1, wherein the drain-charge unit comprises a PMOS transistor having a source and a drain serving as the first terminal and the second terminal of the drain-charge unit, and a gate connected with the drain.

9. The sample-and-hold apparatus as claimed in claim 1, wherein the drain-charge unit comprises an NMOS transistor having a drain and a source serving as the first terminal and the second terminal of the drain-charge unit, and a gate connected with the drain.

10. The sample-and-hold apparatus as claimed in claim 1, wherein the drain-charge unit comprises a current source having a first terminal and a second terminal serving as the first terminal and the second terminal of the drain-charge unit respectively.

11. The sample-and-hold apparatus as claimed in claim 1, wherein the first voltage is a system voltage, and the second voltage is a ground voltage.

12. The sample-and-hold apparatus as claimed in claim 11, wherein the transistor is a PMOS transistor.

13. The sample-and-hold apparatus as claimed in claim 1, wherein the first voltage is a ground voltage, and the second voltage is a system voltage.

14. The sample-and-hold apparatus as claimed in claim 13, wherein the transistor is an NMOS transistor.

15. The sample-and-hold apparatus as claimed in claim 1, wherein the reference voltage is a ground voltage.

16. A sample-and-hold apparatus, comprising:
    a sampling amplifier, having a first input terminal receiving an input signal;

a drain-charge unit, for draining or providing charges, having a first terminal coupled to a second input terminal of the sampling amplifier, and a second terminal coupled to a first voltage; and a plurality of sample-and-hold units, wherein each of the sample-and-hold units comprises:

a transistor, having a first terminal coupled to a second voltage;

a first switch, coupled between an output terminal of the sampling amplifier and a gate of the transistor;

a second switch, having a first terminal coupled to a second terminal of the transistor, and a second terminal coupled to a second input terminal of the sampling amplifier; and a sampling capacitor, having a first terminal coupled to the gate of the transistor, and a second terminal coupled to a reference voltage.

17. The sample-and-hold apparatus as claimed in claim 16, wherein each of the sample-and-hold units further comprises a third switch having a first terminal coupled to the second terminal of the transistor.

18. The sample-and-hold apparatus as claimed in claim 17, further comprising a second drain-charge unit having a first terminal coupled to a second terminal of the third switch of each of the sample-and-hold units, and a second terminal coupled to a third voltage.

19. The sample-and-hold apparatus as claimed in claim 18, wherein the third voltage is a ground voltage.

20. The sample-and-hold apparatus as claimed in claim 18, wherein the third voltage is a system voltage.

21. The sample-and-hold apparatus as claimed in claim 18, further comprising a buffer having an input terminal coupled to a second terminal of the third switch of each of the sample-and-hold units.

22. The sample-and-hold apparatus as claimed in claim 16, further comprising a buffer having an input terminal coupled to the first terminal of the drain-charge unit.

23. The sample-and-hold apparatus as claimed in claim 16, wherein the drain-charge unit comprises a resistor having a first terminal and a second terminal serving as the first terminal and the second terminal of the drain-charge unit respectively.

24. The sample-and-hold apparatus as claimed in claim 16, wherein the drain-charge unit comprises a PMOS transistor having a source and a drain serving as the first terminal and the second terminal of the drain-charge unit, and a gate connected with the drain.

25. The sample-and-hold apparatus as claimed in claim 16, wherein the drain-charge unit comprises an NMOS transistor having a drain and a source serving as the first terminal and the second terminal of the drain-charge unit, and a gate connected with the drain.

26. The sample-and-hold apparatus as claimed in claim 16, wherein the drain-charge unit comprises a current source having a first terminal and a second terminal serving as the first terminal and the second terminal of the drain-charge unit respectively.

27. The sample-and-hold apparatus as claimed in claim 16, wherein the first voltage is a system voltage, and the second voltage is a ground voltage.

28. The sample-and-hold apparatus as claimed in claim 27, wherein the transistor is an NMOS transistor.

29. The sample-and-hold apparatus as claimed in claim 16, wherein the first voltage is a ground voltage, and the second voltage is a system voltage.

30. The sample-and-hold apparatus as claimed in claim 29, wherein the transistor is a PMOS transistor.

31. The sample-and-hold apparatus as claimed in claim 16, wherein the reference voltage is a ground voltage.

32. The sample-and-hold apparatus as claimed in claim 1, wherein:

turning on the first switch and the second switch during a sampling period; and turning off the first switch and turning on the second switch during an output period.

33. The sample-and-hold apparatus as claimed in claim 2, wherein:

turning on the first switch and the second switch and turning off the third switch during a sampling period; and tuning off the first switch and the second switch and turning on the third switch during an output period.

34. The sample-and-hold apparatus as claimed in claim 16, wherein:

turning on the first switch and the second switch of an Ith sample-and-hold unit, and turning off the first switches and the second switches of other sample-and-hold units during an Ith sub-period of a sampling period; and turning on the second switch of the Ith sample-and-hold unit, turning off the second switches of other sample-and-hold units, and turning off the first switches of all sample-and-hold units during an Ith sub-period of an output period.

35. The sample-and-hold apparatus as claimed in claim 17, wherein:

turning on the first switch and the second switch of an Ith sample-and-hold unit, turning off the first switches and the second switches of other sample-and-hold units, and turning off the third switch of each of the sample-and-hold units during an Ith sub-period of a sampling period; and turning on the third switch of the Ith sample-and-hold unit, turning off the third switches of other sample-and-hold units, and turning off the first switch and the second switch of each of the sample-and-hold units during an Ith sub-period of an output period.

36. The sample-and-hold apparatus as claimed in claim 17, wherein:

turning on the first switch and the second switch of an Ith sample-and-hold unit, and turning off the first switches and the second switches of other sample-and-hold units during an Ith period; and turning on the third switch of an $(I-1)^{th}$ sample-and-hold unit, and turning off the third switches of other sample-and-hold units during the Ith period.

* * * * *